US010945913B2

(12) United States Patent
Nelson

(10) Patent No.: US 10,945,913 B2
(45) **Date of Patent: *Mar. 16, 2021**

(54) ROLLER MASSAGE SYSTEM

(71) Applicant: Roll Recovery, LLC, Boulder, CO (US)

(72) Inventor: Jeremy J. Nelson, Boulder, CO (US)

(73) Assignee: Roll Recovery, LLC, Boulder, CO (US)

( * ) Notice: Subject to any disclaimer, the term of this patent is extended or adjusted under 35 U.S.C. 154(b) by 247 days.

This patent is subject to a terminal disclaimer.

(21) Appl. No.: 16/200,246

(22) Filed: Nov. 26, 2018

(65) Prior Publication Data

US 2019/0099323 A1 Apr. 4, 2019

Related U.S. Application Data

(63) Continuation of application No. 15/201,230, filed on Jul. 1, 2016, now Pat. No. 10,143,617, which is a (Continued)

(51) Int. Cl.
*A61H 15/00* (2006.01)

(52) U.S. Cl.
CPC ......... *A61H 15/0092* (2013.01); *A61H 15/00* (2013.01); *H05K 999/99* (2013.01); *A61H 2015/0007* (2013.01); *A61H 2015/0014* (2013.01); *A61H 2015/0021* (2013.01); *A61H 2015/0028* (2013.01);

(Continued)

(58) Field of Classification Search
CPC .......... A61H 7/00; A61H 7/002; A61H 7/003; A61H 7/007; A61H 2007/009; A61H 15/00; A61H 15/0092; A61H 2015/0007; A61H 2015/0014; A61H 2015/0021; A61H 2015/0028; A61H 2015/0035; A61H 2015/0042; A61H 2015/005; A61H 2015/0057; A61H 2015/0064; A61H 2201/1253

See application file for complete search history.

(56) References Cited

U.S. PATENT DOCUMENTS 1,400,547 A * 12/1921 Holmstrom ........ A61H 15/0092 601/125
1,757,060 A 5/1930 Rieth (Continued)

FOREIGN PATENT DOCUMENTS

CN 2399054 Y * 10/2000
JP 11267167 A * 10/1999

(Continued)

OTHER PUBLICATIONS

U.S. Appl. No. 16/269,470; Notice of Allowance dated Sep. 29, 2020.

(Continued)

*Primary Examiner* — Colin W Stuart
(74) *Attorney, Agent, or Firm* — Craig R. Miles; CR Miles P.C.

(57) ABSTRACT

A roller massage system provides a pair of roller massage assemblies in opposed adjustable spaced relation to allow engagement of each one of the pair of roller massage assemblies on a corresponding massageable portion of the body.

15 Claims, 9 Drawing Sheets

Related U.S. Application Data continuation of application No. 14/350,561, filed as application No. PCT/US2012/063750 on Nov. 6, 2012, now Pat. No. 9,622,937, which is a continuation-in-part of application No. 29/435,812, filed on Oct. 29, 2012, now Pat. No. Des. 688,380.

(60) Provisional application No. 61/628,882, filed on Nov. 7, 2011.

(52) U.S. Cl.
CPC ................ *A61H 2015/0035* (2013.01); *A61H 2015/0057* (2013.01); *A61H 2201/1253* (2013.01); *A61H 2205/06* (2013.01); *A61H 2205/065* (2013.01); *A61H 2205/08* (2013.01); *A61H 2205/086* (2013.01); *A61H 2205/10* (2013.01); *A61H 2205/106* (2013.01); *A61H 2205/108* (2013.01); *A61H 2205/12* (2013.01)

(56) References Cited

U.S. PATENT DOCUMENTS

| | | | | |
|---|---|---|---|---|
| 2,219,086 | A | 10/1940 | Broberg | |
| 2,219,138 | A | 10/1940 | Morrison | |
| 3,465,750 | A * | 9/1969 | Schawalder ........... | A63B 21/04 601/122 |
| 3,583,396 | A * | 6/1971 | Landis ............... | A61H 15/0092 601/125 |
| 3,759,250 | A | 9/1973 | Salata | |
| 3,970,078 | A * | 7/1976 | Rogers, Jr. ......... | A61H 15/0092 601/125 |
| 4,210,135 | A | 7/1980 | Deuser | |
| 4,712,539 | A * | 12/1987 | Kim ................... | A61H 15/0092 601/120 |
| 4,945,900 | A | 8/1990 | Masuda | |
| 4,989,585 | A * | 2/1991 | Auker ................ | A61H 15/0092 601/118 |
| 5,735,803 | A | 4/1998 | Musilli | |
| 6,974,427 | B1 | 12/2005 | Lapham | |
| D688,380 | S | 8/2013 | Nelson | |
| 9,622,937 | B2 * | 4/2017 | Nelson ................... | A61H 15/00 |
| 10,143,617 | B2 | 12/2018 | Nelson | |
| 2002/0165073 | A1 * | 11/2002 | Tsai ................... | A61H 15/0092 482/148 |
| 2004/0254508 | A1 | 12/2004 | Lee | |
| 2005/0159688 | A1 | 7/2005 | Sakamoto et al. | |
| 2005/0203445 | A1 | 9/2005 | Tsai | |
| 2007/0173750 | A1 | 7/2007 | Hudock | |
| 2008/0103421 | A1 | 5/2008 | Nicholson | |
| 2010/0185128 | A1 | 7/2010 | Galvez Campos | |
| 2011/0137218 | A1 | 6/2011 | Collins | |
| 2013/0109546 | A1 | 5/2013 | Huang | |

FOREIGN PATENT DOCUMENTS

| | | |
|---|---|---|
| JP | 2003-019173 | 1/2003 |
| JP | 2004-097459 | 4/2004 |
| JP | 2007-130327 | 5/2007 |
| WO | 2013/070632 A1 | 5/2013 |

OTHER PUBLICATIONS

U.S. Appl. No. 61/628,882, filed Nov. 7, 2011.

International Patent Cooperation Treaty Patent Application No. PCT/US2012/063750, filed Nov. 6, 2012.

Corresponding European Patent Application No. 12848115.7; Office Action dated May 18, 2015, 7 pages total.

EBAY. New PTP Foot Roller from Rebel Sport. Website, http://www.ebay.com.au, originally downloaded May 15, 2017, 3 pages total.

PTP. Foot Roller—PTPfit. Website, https://www.ptpfit.com, originally downloaded May 3, 2015, 8 pages total.

Dick'S Sporting Goods. Fitness Gear Leg Massager. Website, https://www.dickssportinggoods.com, originally downloaded May 14, 2018, 2 pages.

* cited by examiner

ROLLER MASSAGE SYSTEM

This United States Patent Application is a continuation of U.S. patent application Ser. No. 15/201,230, filed Jul. 1, 2016, now U.S. Pat. No. 10,143,617, issued Dec. 4, 2018, which is a continuation of U.S. patent application Ser. No. 14/350,561, filed Apr. 8, 2014, now U.S. Pat. No. 9,622,937, issued Apr. 18, 2017, which is a United States National Stage of International Patent Cooperation Treaty Patent Application No. PCT/US2012/063750, filed Nov. 6, 2012, which is a continuation-in-part of United States Design Patent Application No. 29/435,812, filed Oct. 29, 2012, now U.S. Pat. No. D688,380, issued Aug. 20, 2013, and claims the benefit of U.S. Provisional Patent Application No. 61/628,882, filed Nov. 7, 2011, each hereby incorporated by reference herein.

I. TECHNICAL FIELD

A roller massage system provides a pair of roller massage assemblies in opposed adjustable spaced relation to allow engagement of each one of the pair of roller massage assemblies on a corresponding massageable portion of the body.

II. BACKGROUND

Conventional massage devices may provide a roller which can be drawn along the surface of the body. The amount of pressure exerted by the roller on the surface of the body depends directly on the amount of force exerted by the user on the massage device. Accordingly, different parts of the body may be treated differently. Additionally, the user may experience fatigue and the amount of force applied may vary to a greater or lesser degree on the massageable portion of the body or the user may not be able to complete the massage of the massageable portion of the body.

The instant invention provides a roller massage system and method of massaging which addresses the problems related to conventional massage devices.

III. DISCLOSURE OF INVENTION

Accordingly, a broad object of the invention can be to provide a roller massage system having a pair of roller massage assemblies in opposed adjustable spaced relation to allow engagement of each one of the pair of roller massage assemblies on a corresponding massageable portion of the body.

Another substantial object of the invention can be to provide a roller massage system having a first and second pair of handle supports which function to allow the pair of roller massage assemblies to travel between a closed condition and an open condition while maintaining a substantially parallel opposed relation useful in engaging each one of the roller assemblies on a corresponding massageable portion of the body.

Another substantial object of the invention can be to provide a pair of handles one each coupled to a corresponding one of the pair of roller massage assemblies which allows the pair of roller massage assemblies to travel between the closed condition and the open condition by drawing the pair of handles apart under forcible urging of the user's hands.

Naturally, further objects of the invention are disclosed throughout other areas of the specification, drawings, photographs, and claims.

IV. BRIEF DESCRIPTION OF THE DRAWINGS

V. MODE(S) FOR CARRYING OUT THE INVENTION

Figure 1:
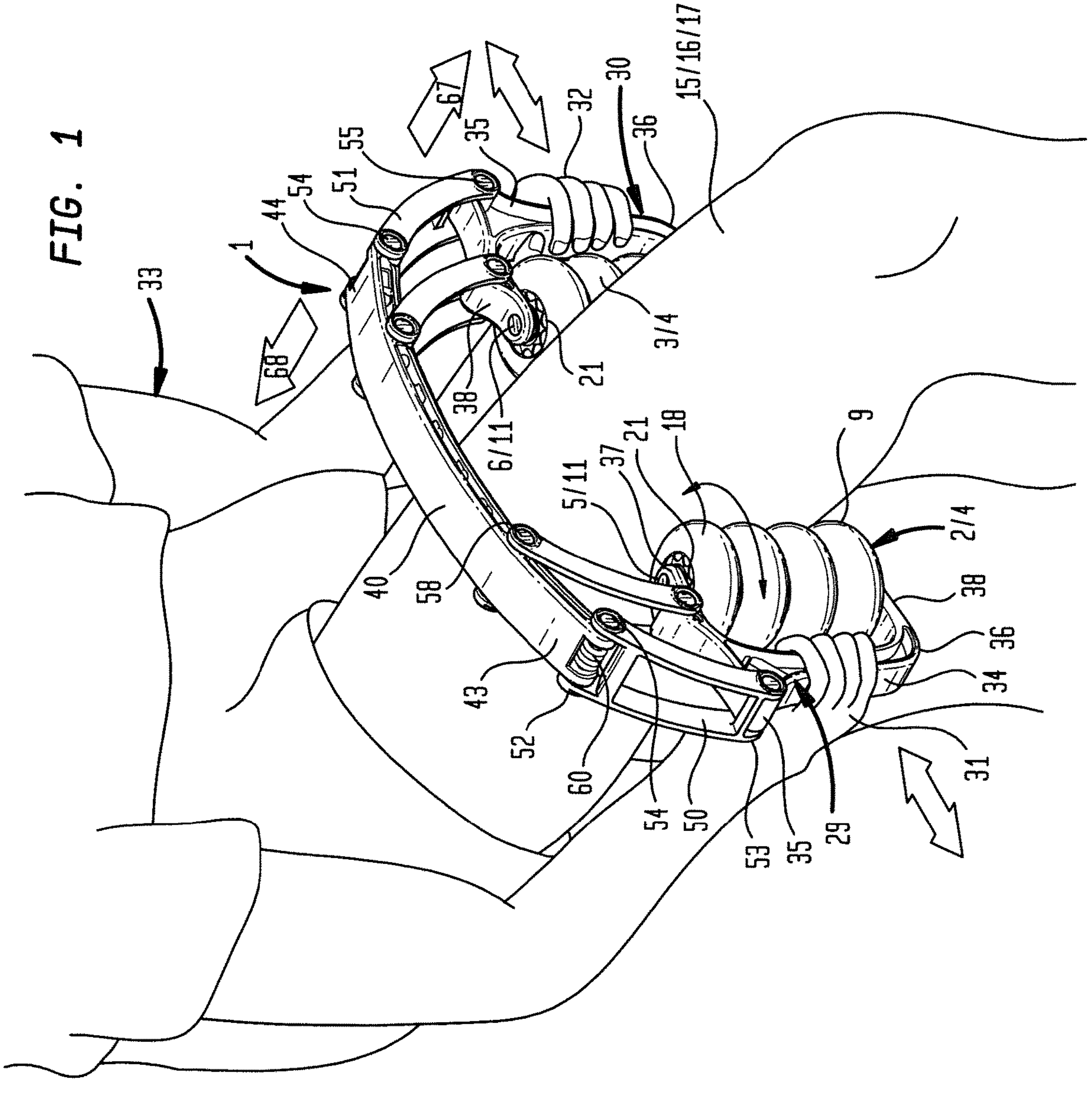
FIG. 1 is an illustration of a method of using an embodiment the inventive roller massage device.

First, referring primarily to FIGS. 1-10, embodiments of the inventive roller massage device (1) provide a pair of roller assemblies (2)(3). Each of the pair of roller assemblies (2)(3) can include one or more roller elements (4). As to particular embodiments, each of the pair of roller assemblies (2)(3) can have one roller element (4). As to other embodiments, each of the pair of roller assemblies (2)(3) can have a plurality of roller elements (4), such as two, three, four, five, six or more depending upon the application. The one roller element (4) or the plurality of roller elements (4) of each of the pair of roller assemblies (2)(3) can be correspondingly rotatably coupled to a pair of axles (5)(6).

Figure 3:
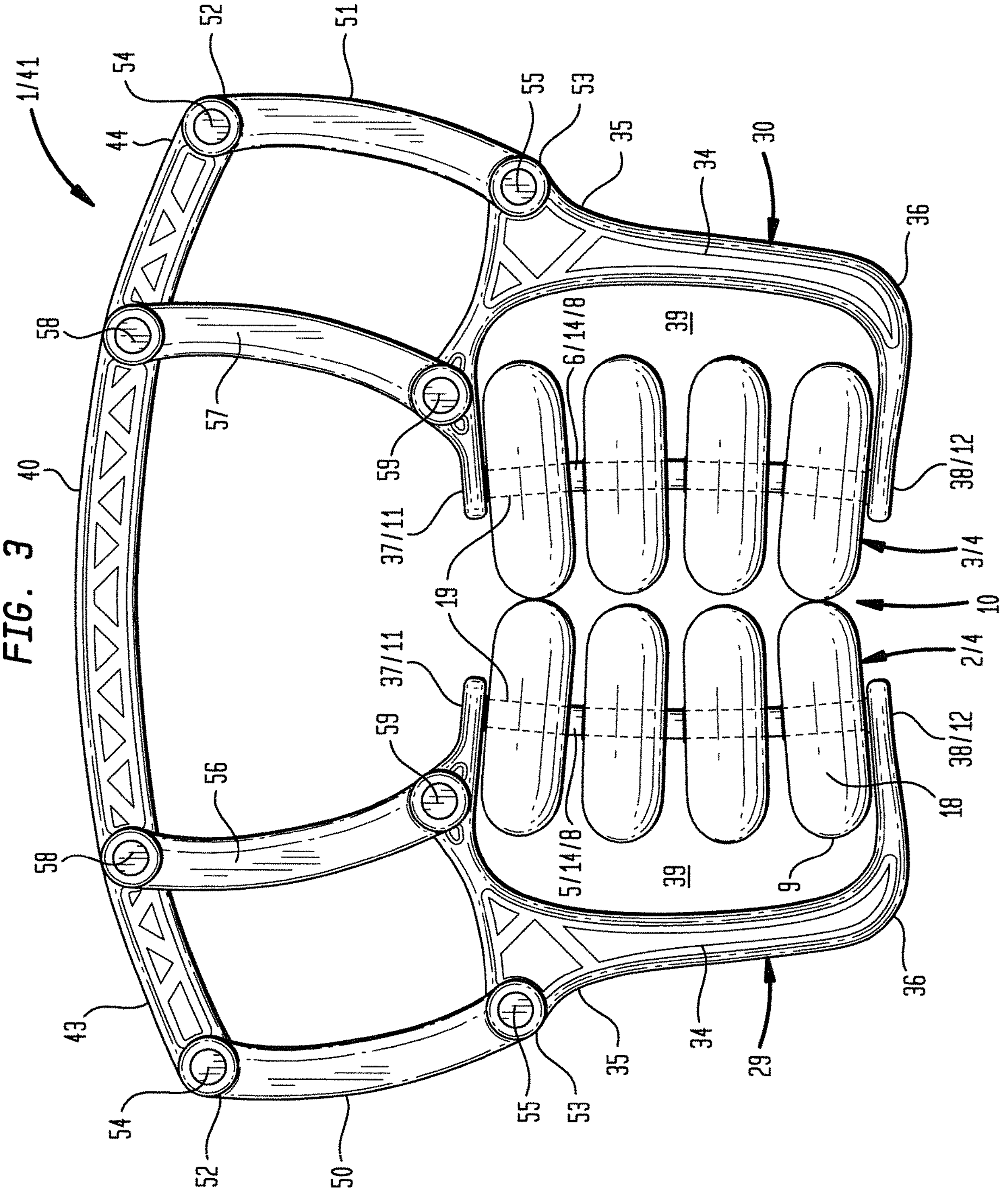
FIG. 3 is a front view of a particular embodiment the inventive roller massage device in the closed condition.
Figure 4:
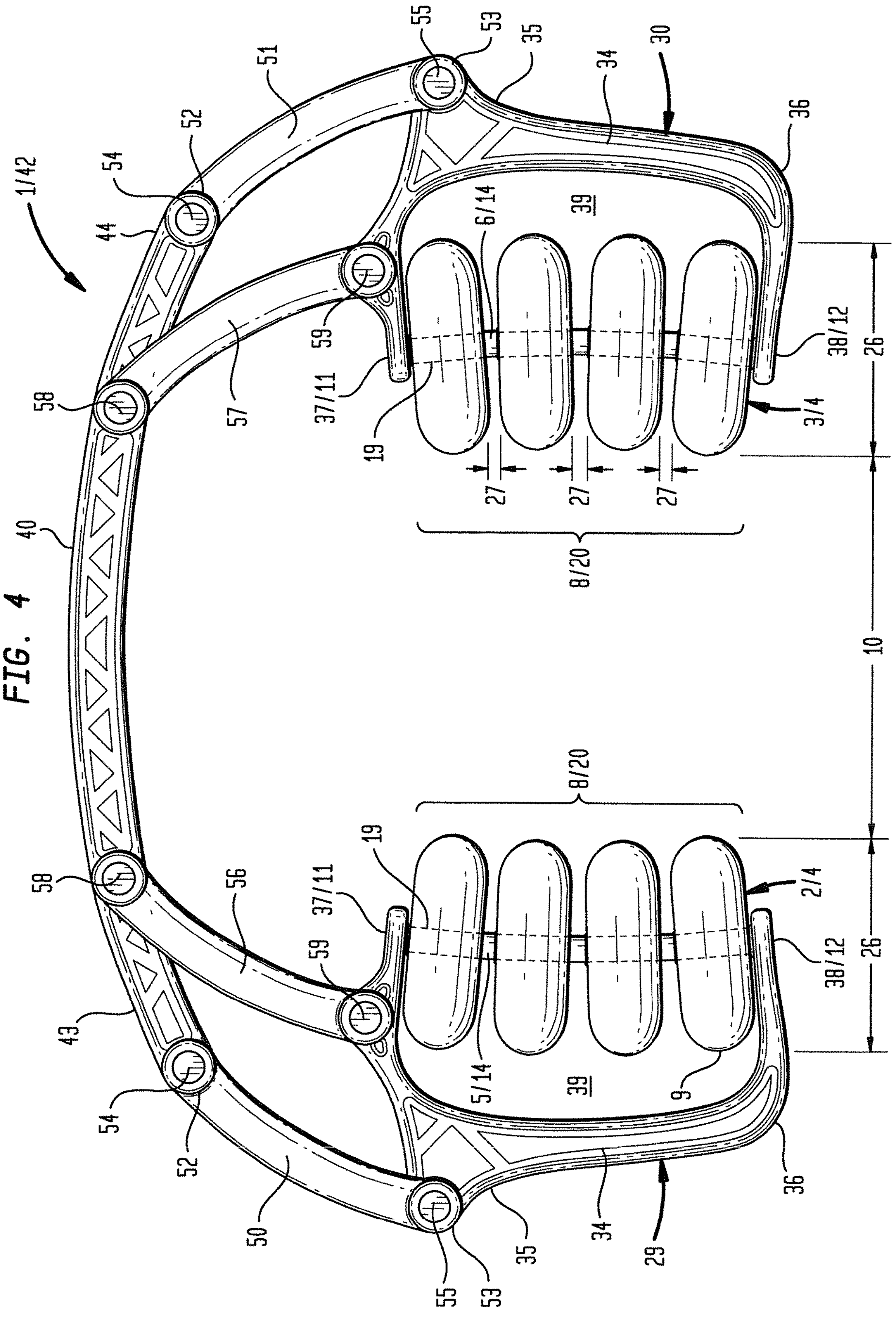
FIG. 4 is a front view of a particular embodiment of the inventive roller massage device in the open condition.
Figure 8:
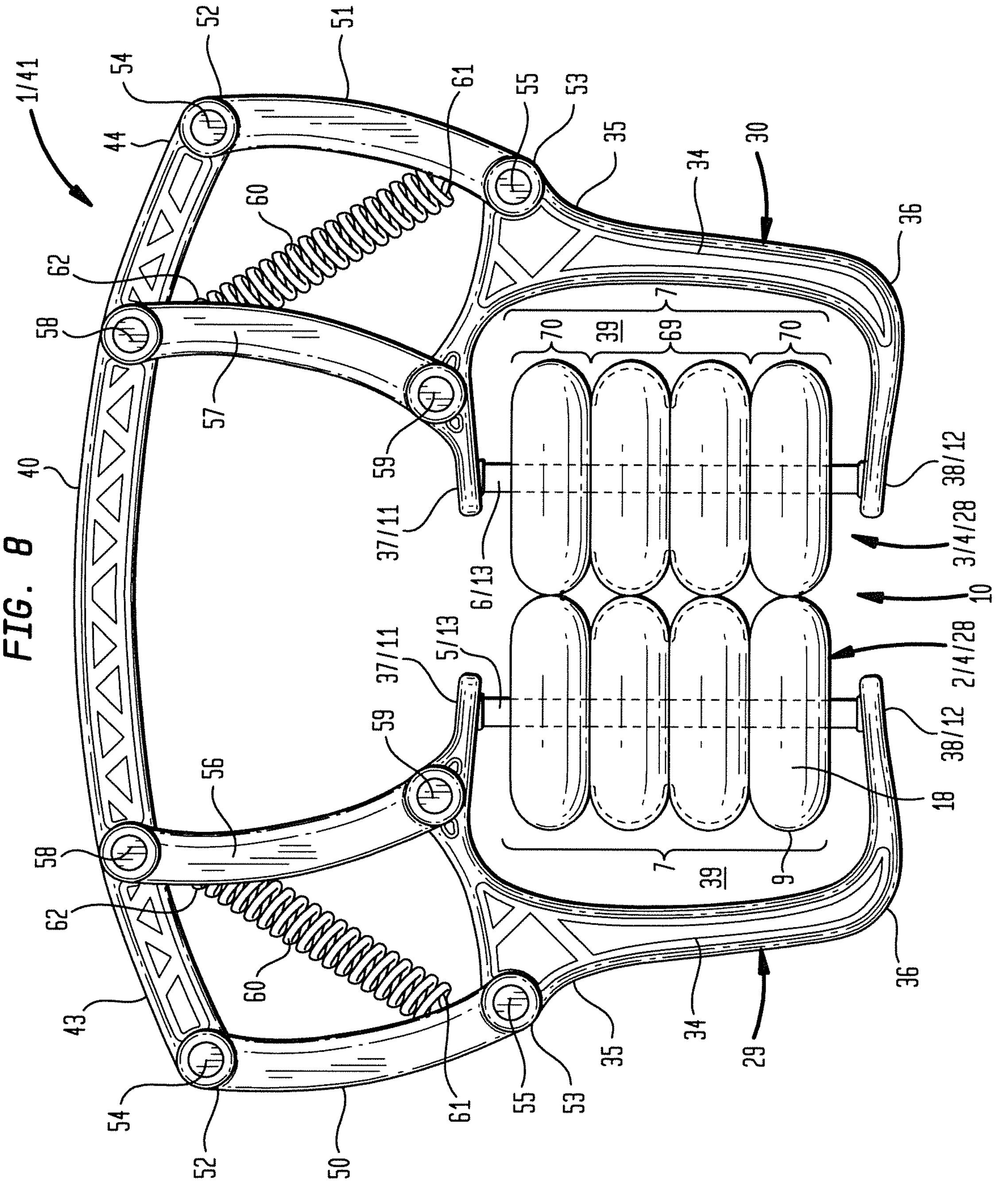
FIG. 8 is a side view of a particular embodiment of the inventive roller massage device having a pair of linear axles and an elastic member in the form of an extension spring.

As to embodiments having a plurality of roller elements (4), each of the plurality of roller elements (4) of the pair of roller assemblies (2)(3) can be correspondingly rotatably coupled to the pair of axles (5)(6) in adjacent abutted engagement (7) (as shown in the example of FIG. 8) or spaced engagement (8) (as shown in the examples of FIGS. 3 and 4) along the length of each of the pair of axles (5)(6).

As to particular embodiments, the pair of axles (5)(6) can be disposed or maintained in mirror image symmetry a distance apart to correspondingly locate an outer periphery (9) of the one or more roller elements (4) of the pair of roller assemblies (2)(3) in opposed adjacent relation (10) (as shown in the example of FIG. 3) or opposed mirror image symmetry (10) a distance apart (as shown in the example of FIG. 4).

As to other embodiments, the pair of axles (5)(6) and the corresponding pair of roller assemblies (2)(3) can be adjusted to dispose the pair of roller assemblies (2)(3) in various spatial relationship as further described below.

Each of the pair of axles (5)(6) can be linear (13) (as shown in the example of FIG. 8) having a length disposed between opposed axle ends (11)(12); however, the invention is not so limited, and each of the pair of axles (5)(6) can be arcuate or have an amount of curvature (14) between the opposed axel ends (11)(12)(as shown in the examples of FIGS. 3 and 4). The amount of curvature (14) in each of the pair of axles (5)(6) can be a greater or lesser amount of curvature (14) to provide the advantage of engagement of the one or more roller elements (4) with corresponding curvature of a massageable portion (15) of a body (16).

As shown by the example of FIG. 1, the massageable portion (15) of the body (16) may be generally tubular such as the upper portion of the leg (17). The amount of curvature (14) as to particular embodiments can be sufficient to allow a plurality of roller elements (4) to engage the corresponding curvature of the massageable portion (15) of the body (16) with greater uniformity than in embodiments in which the pair of axles (5)(6) are generally linear (13) in configuration. As to particular embodiments, the amount of curvature (14) in each of the pair of axles (5)(6) can define a radius in the range of about 12 inches to about 30 inches; although as to particular embodiments, the radius defined by the amount of curvature (14) of each of the pair of axles (5)(6) can be greater or lesser depending on the application.

Now referring primarily to FIGS. 1-10, the one or more roller elements (4) can each be in the form of an annular member (18) which defines an outer periphery (9) and a central aperture element (19). One of the pair of axles (5)(6) passes through the central aperture element (19) allowing adjacent abutted engagement (7) or spaced engagement (8) of the plurality of roller elements (4) along the axle length (20). As to certain embodiments, each of the one or more roller elements (4) can further include a hub element (21) which includes the central aperture element (19). The annular member (18) can be in secured fixed relation to the hub element (21) such that rotation of the hub element (21) about one of the pair of axles (5)(6) generates a corresponding rotation in the annular member (18). The central aperture element (19) can be in the form of one or more roller element bearings (22) having an bearing inner race (23) which defines the central aperture element (19) and an bearing outer race (24) separated by bearing elements (25) which assist to reduce friction in rotation of the one or more roller elements (4) about the corresponding one of the pair of axles (5)(6). The hub element (21) can be made from any substantially rigid material such as a metal, a ceramic, a plastic, a wood, or the like. Particular embodiments of the annular member (18) can also be made from a substantially rigid material, as above described, or as to other embodiments can be made from a resiliently elastic material which to an extent deforms on engagement with the massageable portion (15) of the body (16) such as a plasticized resin, a silicone rubber, a fluoropolymer, a natural or synthetic rubber, polyurethane, or the like.

Figure 2:
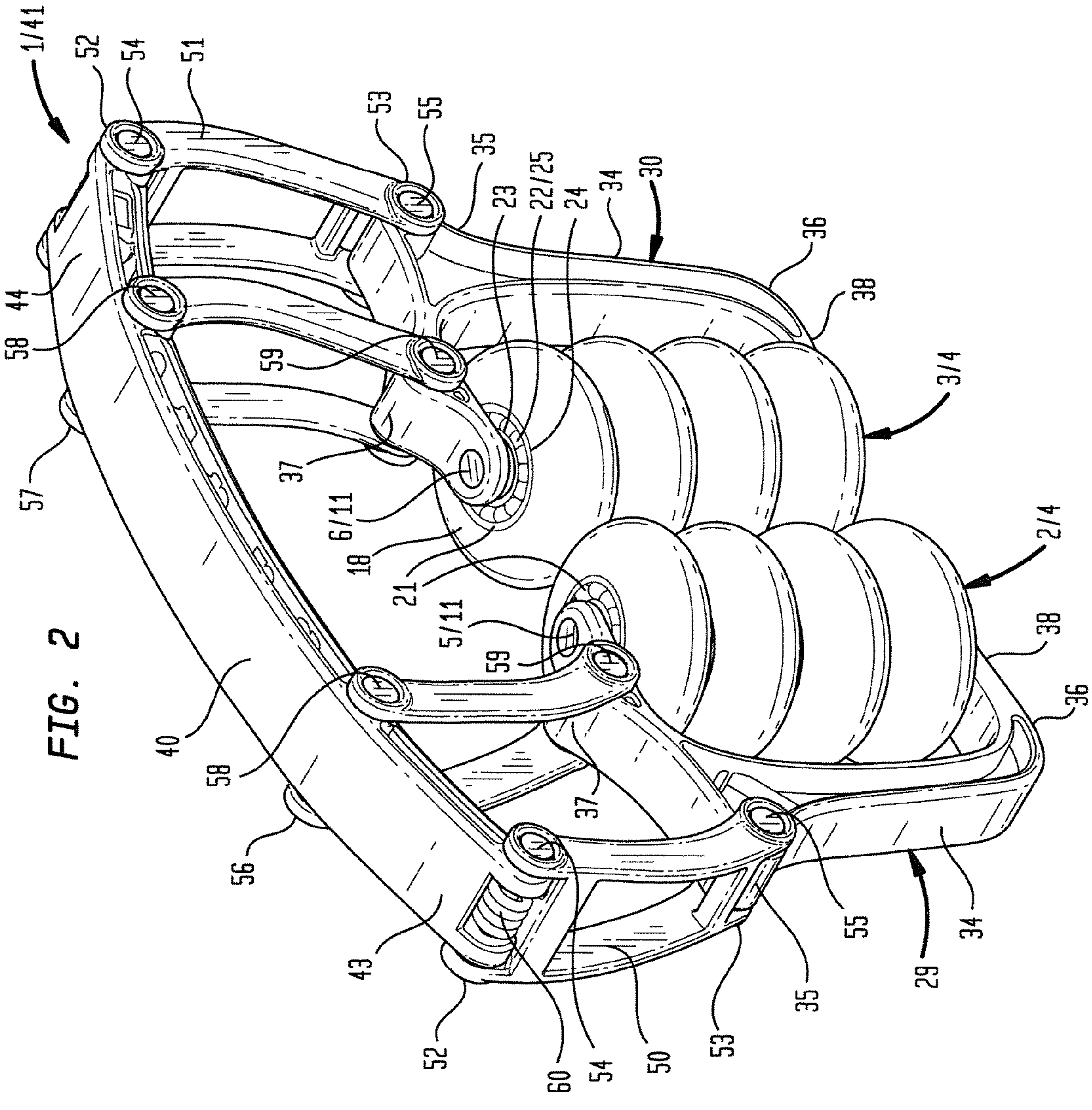
FIG. 2 is a perspective view of a particular embodiment of the inventive roller massage device.
Figure 7:
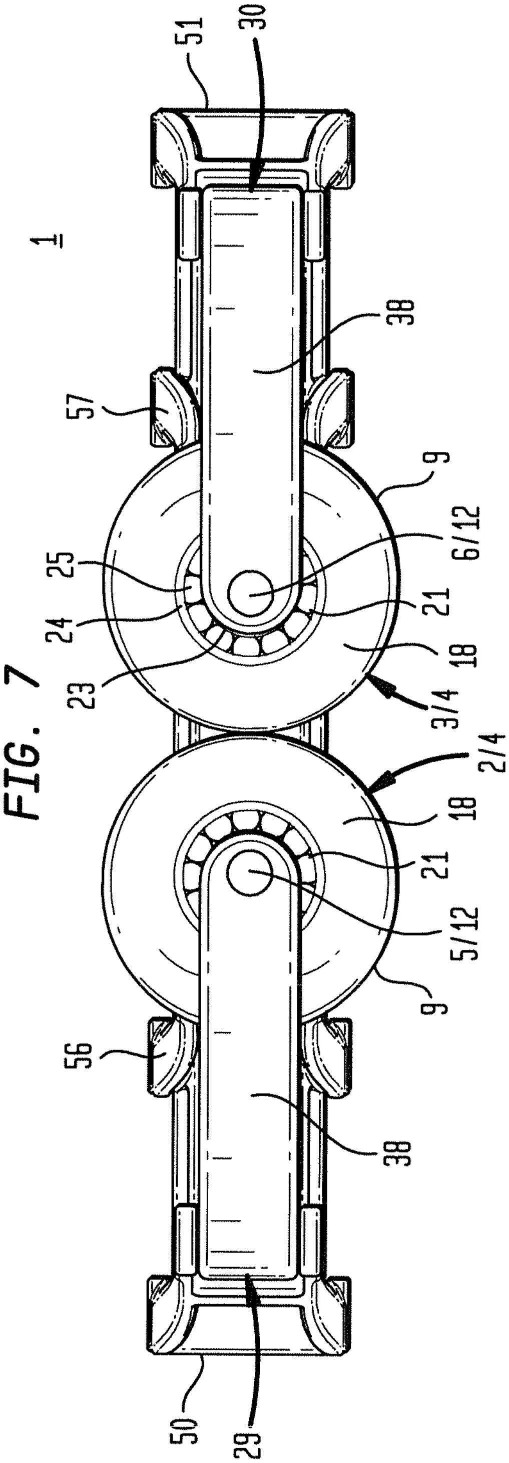
FIG. 7 is a bottom view of a particular embodiment of the inventive roller massage device.

Now referring primarily to FIGS. 2 and 7, the one or more roller elements (4) can define a generally circular outer periphery (9) (as shown in the example of FIG. 2); however, the invention is not so limited and each of the roller elements (4) can define an outer periphery (9) useful in massaging a massageable portion (15) of the body (16). The outer periphery (9) can, as illustrative examples, define a circular outer periphery, an oval outer periphery, a hexagonal outer periphery, a septagonal outer periphery, an octagonal outer periphery, or the like, which can be used in various permutations and combinations.

Figure 5:
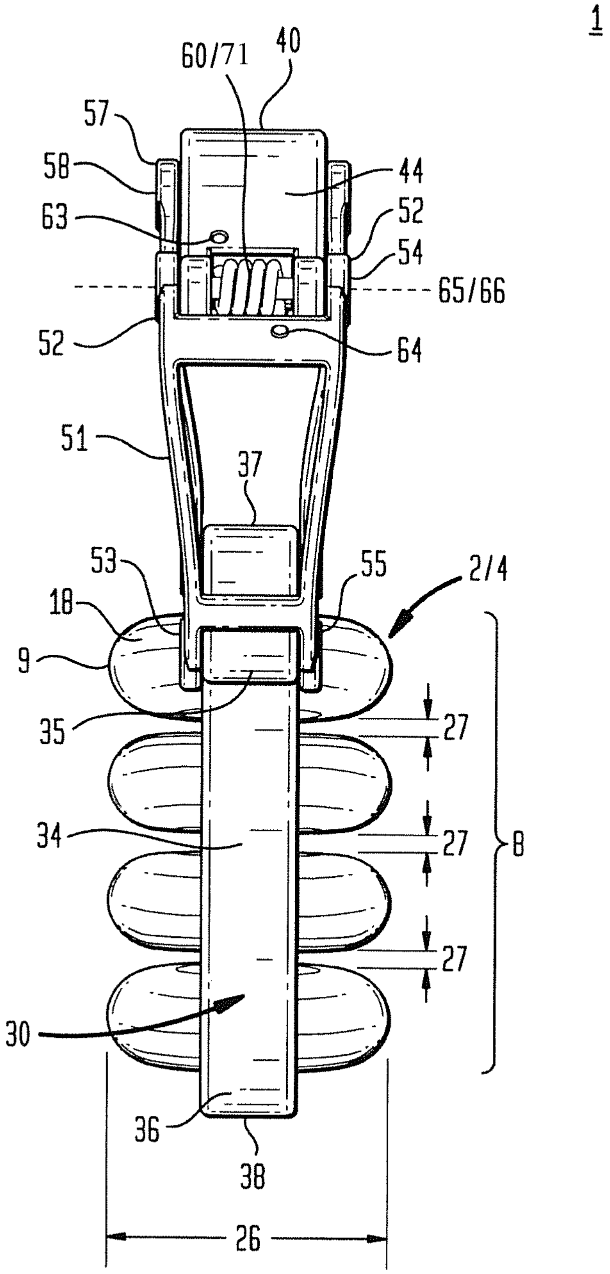
FIG. 5 is a side view of a particular embodiment of the inventive roller massage device.
Figure 6:
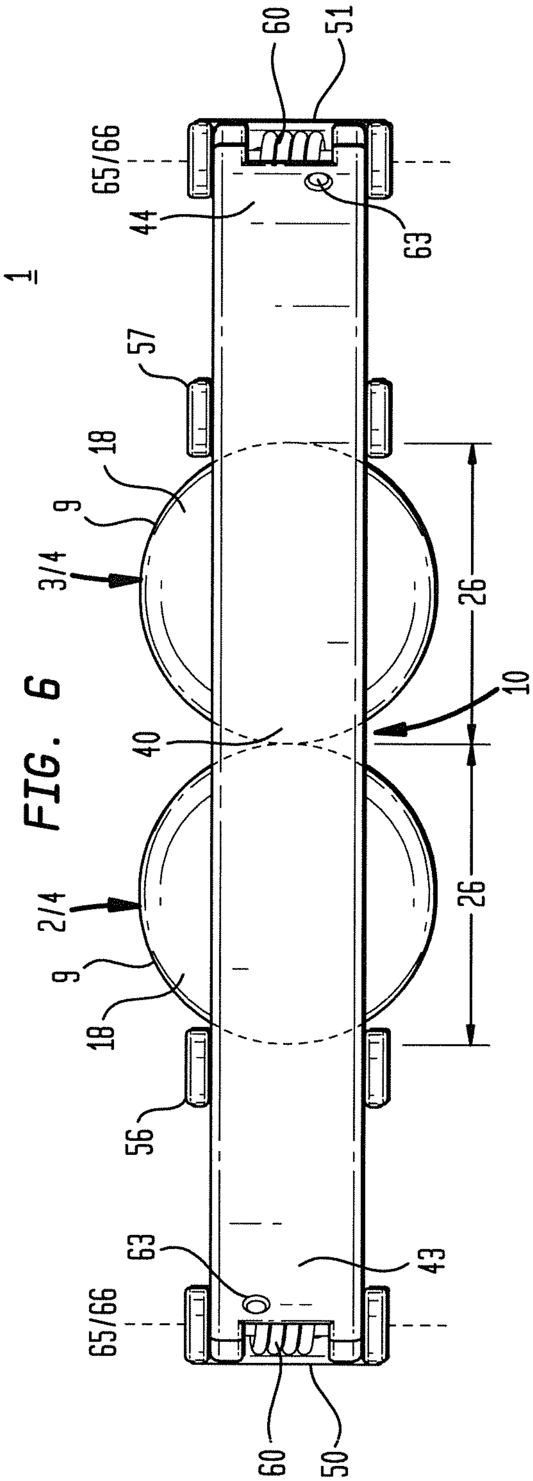
FIG. 6 is a top view of a particular embodiment of the inventive roller massage device.

As to the illustrative example shown in FIGS. 1-10, four roller elements (4) can be rotationally coupled to each of the pair of axles (5)(6) each having a diameter (26) in the range of about one to about three inches (as shown in the example of FIG. 5) and a thickness of about three eighths inch to about one inch (as shown in the example of FIG. 5) depending upon the application; however, the invention can include embodiments having a greater or lesser diameter (26) depending upon the application. Spaced engagement (8) of the four roller elements (4) as shown can provide an inter-roller space (27) in the range of about one-eighth inch to about one half inch depending on the application; however, certain embodiments may have roller elements (4) having adjacent abutted engagement (7) as above described (as shown in the example of FIG. 8).

As to particular embodiments, each of the pair of roller assemblies (2)(3) can be provided as a one piece roller (28) having a plurality of roller elements (4)(as shown in broken line in the example of FIG. 8). Embodiments of the one piece roller (28) can provide a plurality of roller elements (4) discretely formed or fabricated and subsequently interconnected to provide a one piece roller (28), or a plurality of roller elements (4) formed or fabricated in common as a one piece roller (28). In embodiments which provide a one piece roller (28), the plurality of rollers (4) all rotate about a corresponding one of the pair of axles (5)(6) at the same rate about a linear axle (13) (as shown in the example of FIG. 8 with the one piece roller (28) shown in broken line). As to particular embodiments, the one piece roller (28) can provide a medial portion (69) disposed can have a pair of end portions (70). The portion of the plurality of roller elements (4) disposed in the medial portion (69) can have lesser diameter than the portion of the plurality of roller elements (4) disposed in the pair of end portions (70).

Now referring primarily to FIGS. 1, 3 and 4, the roller massage device (1) can further provide a pair of handles (29)(30) each configured for grippable engagement with a corresponding one of a pair of hands (31)(32) of a user (33) (as shown in the example of FIG. 1). The pair of handles (29)(30) can be made responsive to the corresponding pair of roller assemblies (2)(3) such that travel (67)(68) of the pair of handles (29)(30) results in corresponding travel of the pair of roller assemblies (2)(3). As one illustrative example, each one of the pair of handles (29)(30) can include a handle grip (34) disposed between a handle first end (35) and a handle second end (36), and a pair of axle supports (37)(38) correspondingly coupled to the handle first end (35) and said handle second end (36). The pair of axle supports (37)(38) correspondingly extend from the handle first end (35) and the handle second end (36) of the handle grip (34) in generally opposed relation to define a pass through (39). The opposed axle ends (11)(12) (also referred to as the axle first end (11) and the axle second end (12)) correspondingly couple to the pair of axle supports (37)(38) to dispose a corresponding one of the pairs of roller assemblies (2)(3) within the pass through (39). The pass through (39) can further provide sufficient open space between the outer periphery (9) of the one or more roller elements (4) of the corresponding one of the pair of roller assemblies (2)(3) and the corresponding one of the pair of handles (29)(30) to allow one of the pair of hands (31)(32) of the user (33) to grippingly engage the handle grip (34) of one of the pair of handles (29)(30) without engaging the outer periphery (9) of the corresponding one of the pair of roller assemblies (2)(3).

Now referring primarily to FIGS. 1-10, the roller massage device (1) can further include a cross member (40) to which the pair of handles (29)(30) can be directly or indirectly coupled to dispose the one or more roller elements (4) of the pair of roller massage assemblies (2)(3) in substantially opposed adjacent relation (10) (as shown in the example of FIG. 3) (also referred to as the "closed condition" (41)). The structure of the cross member (40) or the manner in which the pair of handles (29)(30) couple to the cross member (40)

(or both) allow the user (33) to draw the pair of handles (29)(30) apart under outward forcible urging to dispose the one or more roller elements (4) a sufficient distance apart to be disposed about the massageable portion (15) of the body (16) (as shown in the example of FIG. 4) (also referred to as the "open condition" (42)).

Figure 9:
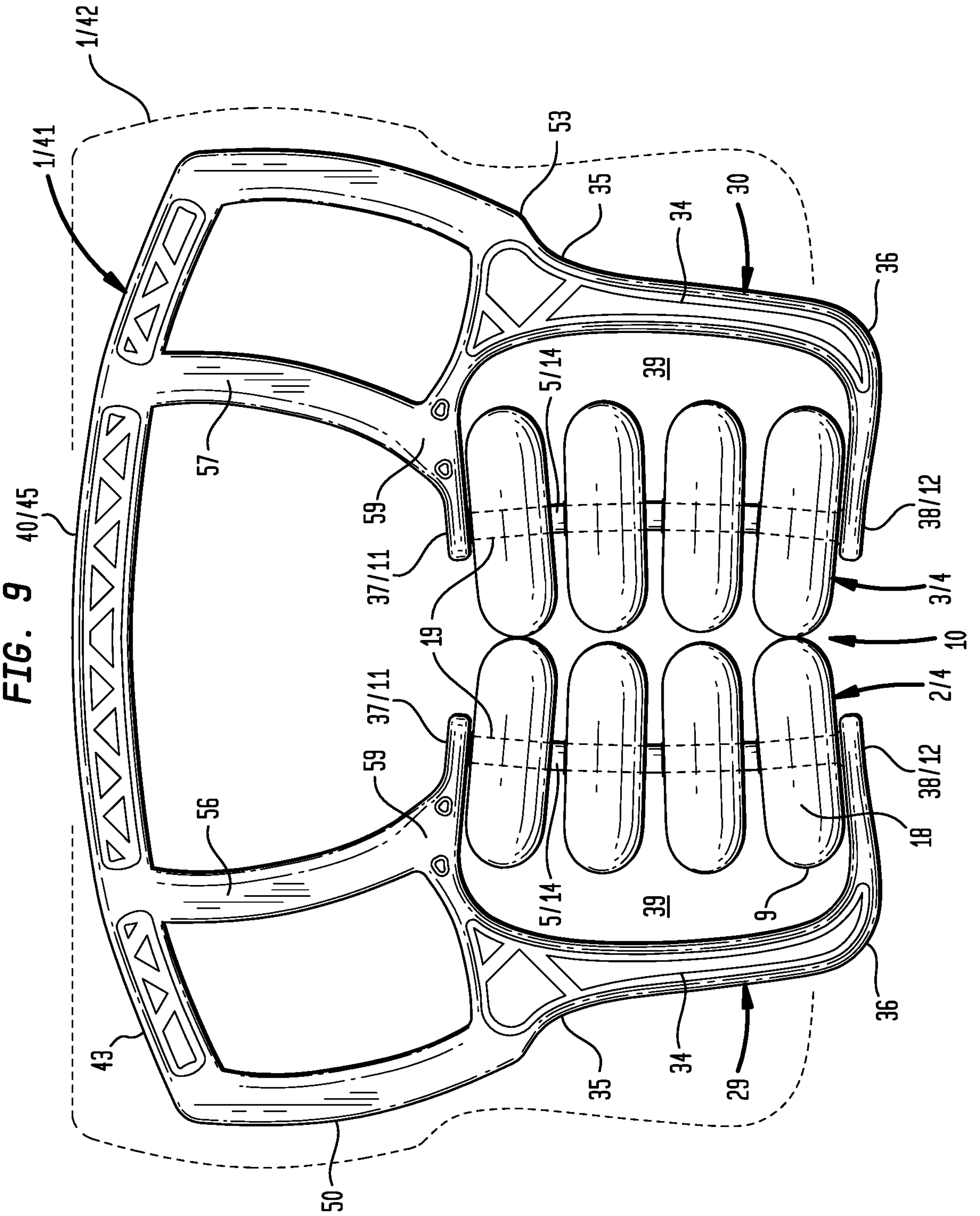
FIG. 9 is a side view of a particular embodiment of the inventive roller massage device having cross member sufficiently resiliently flexible to allow a pair of handles to be drawn apart.

Now referring primarily to FIG. 9, as to certain embodiments, the pair of handles (29)(30) can be correspondingly connected proximate a first cross member end (43) and a second cross member end (44). The cross member (40) can be sufficiently resiliently flexible (45) to allow the pair of handles (29)(30) to be drawn apart under outward forcible urging by the user (33) toward the open condition (42). As to these embodiments, the cross member (40) and the pair of handles (29)(30) may be produced as a one piece.

Figure 10:
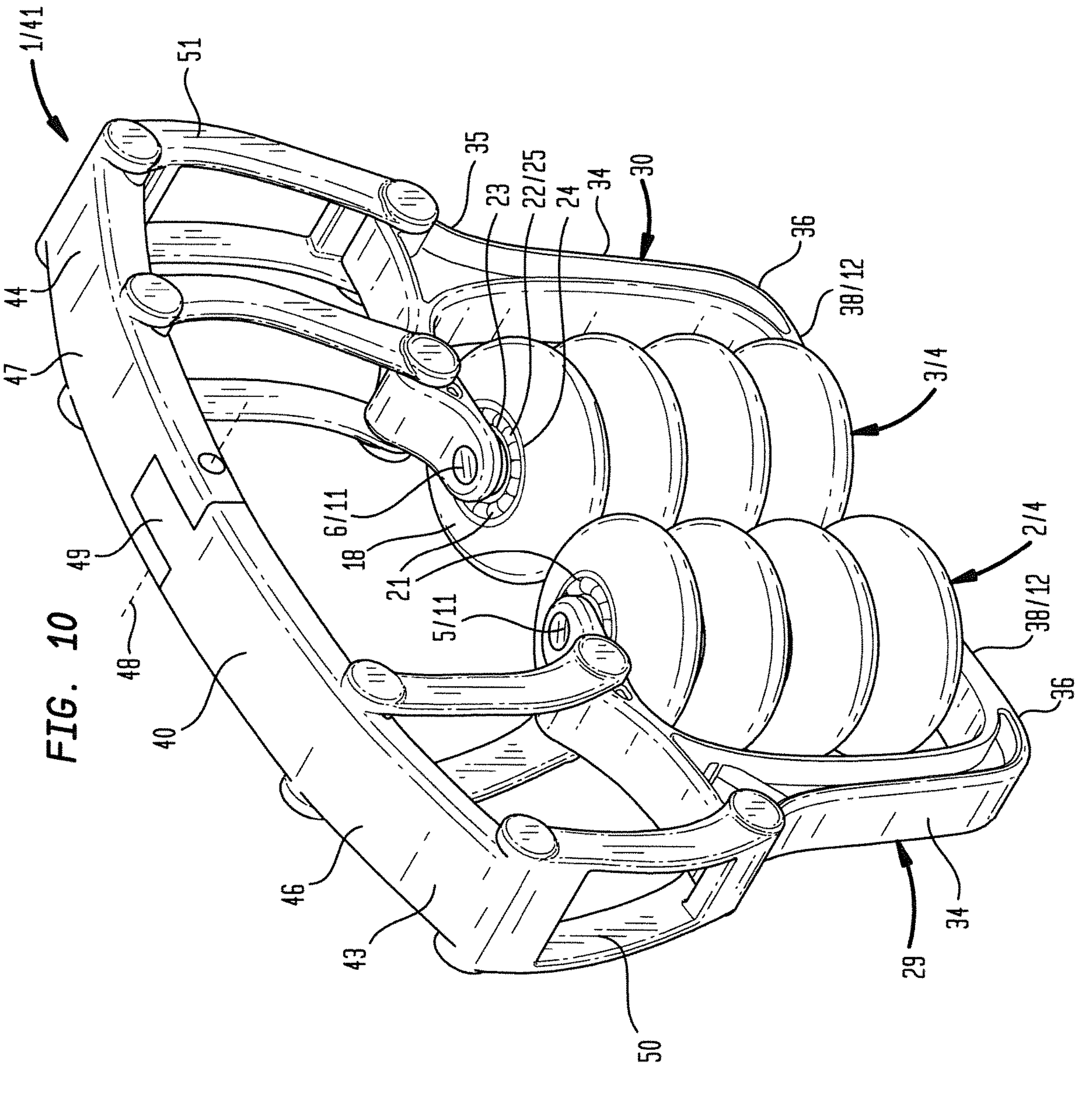
FIG. 10 is a perspective view of a particular embodiment of the inventive roller massage device having a cross member which includes a first portion pivotally coupled to a second portion to allow a pair of handles to be drawn apart.

Now referring primarily to FIG. 10, as to other embodiments, the cross member (40) can be formed from a first portion (46) and a second portion (47) centrally pivotally joined to allow the pair of handles (29)(30) to be drawn apart under sufficient forcible urging to generate rotation of the pair of handles (29)(30) about a central pivot axis (48) of a cross member pivot element (49) to achieve the open condition (42).

Now referring primarily to FIGS. 1-7, as to other embodiments, the cross member (40) can take the form of a one-piece substantially inflexible cross member (40) to which one of the pair of handles (29)(30) pivotally join proximate the first cross member end (43) and a second cross member end (44). Rotation of each of the pair of handles (29)(30) about a corresponding one of a pair of handle pivots (54) allows the pair of handles (29)(30) to be drawn apart under outward forcible urging by the user (33) to achieve the open condition (42).

Now referring primarily to FIGS. 1-7, the roller massage device (1) can further include a first pair of handle supports (50)(51) each having length disposed between a handle support first end (52) and a handle support second end (53). Each of the first pair of handle supports (50)(51) can be pivotally coupled by a handle support first end (52) to a corresponding one of the first cross member end (43) and the second cross member end (44) of the cross member (40). Each the first pair of handle supports (50)(51) can be pivotally coupled by a handle support second end (53) to a corresponding one of the pair of handles (29)(30).

Outward forcible urging of the pair of handles (29)(30) by the user (33) toward the open condition (42) generates rotation of the first pair of handle supports (50)(51) about a corresponding pair of handle support first end pivots (54). The pair of handles (29)(30) can be further rotated about a corresponding pair of handle support second end pivots (55) to alter spatial relation of the pair of roller assemblies (2)(3).

Embodiments which include a first pair of handle supports (50)(51) afford the advantage of allowing the pair of roller assemblies (2)(3) to be disposed in opposed bilateral symmetry over a greater range of travel, and further affords the advantage of allowing the user (33) to dispose the pair of roller assemblies (2)(3) other spatial relations depending upon the application.

Again referring primarily to FIGS. 1-7, the roller massage device (1) can further include a second pair of handle supports (56)(57) each having length disposed between a second handle support first end (58) and a second handle support second end (59). Each of the second pair of handle supports (56)(57) can be pivotally coupled to the cross member (40) a distance inward of the first pair handle supports (50)(51) by the second handle support first ends (58) and pivotally coupled to the handles (29)(30) a distance inward of the first pair of handle supports (50)(51) by the second handle support second ends (59).

Outward forcible urging of the pair of handles (29)(30) by the user (33) toward the open condition (41) generates rotation of the first pair of handle supports (50)(51) and the second pair of handle supports (56)(57) about the corresponding pairs of first and second handle support first end pivots (54)(58) and pairs of first and second handle support second end pivots (55)(59) allowing the pair of handles (29)(30) to be drawn apart. However, the second pair of handle supports (56)(57) limits the range of rotation of the pair of handles (29)(30) in relation to the first pair of handle supports (50)(51) to disposing the pair of roller assemblies (2)(3) in generally opposed mirror image symmetry over the entire range of travel between the closed condition (41) and the open condition (42) (as shown in the examples of FIGS. 3 and 4).

Again referring primarily to FIGS. 1-8, the roller massage device (1) can further include one or more elastic elements (60) which act on the pair of handles (29)(30) to generate travel of the pair of roller assemblies (2)(3) toward the closed condition (41). The elastic elements (60) can comprise or be selected from the group consisting of an elastic member, elastic cord, elastic bands, springing element, extension spring, coil spring, torsional spring, or the like, which when stretched or twisted exerts a restoring force which tends to return the elastic element (60) to the original unstretched or untwisted condition.

As one illustrative example, an elastic element first end (61) and an elastic element second end (62) of an elastic element (60) in the form of an elastic band, elastic cord, or extension spring can be correspondingly connected proximate the center of the cross member (40) and each of the corresponding handles (29)(30) to generate travel of the corresponding pair of roller assemblies (2)(3) toward the closed condition (41) (as shown in the example of FIG. 8).

As another illustrative example, an elastic element (60) in the form of a torsion spring (71) can wound about the handle support first end pivots (54)(as shown in the examples of FIGS. 1-7). Each of the spring first ends (63) can be engaged to the cross member (40) and each of the spring second ends (64) can be responsive to movement of a corresponding one of the pair of handles (29)(30). Outward forcible urging of the pair of handles (29)(30) by the user (33) toward the open condition (42) twists the torsion spring (71) about a spring axis (65) coincident with the pivot axis (66) of the handle support first end pivots (54). Release of forcible urging of the pair of handles (29)(30) returns the torsion spring (71) toward the untwisted condition urging the pair of handles (29)(30) toward the closed condition (41).

Now referring primarily to FIG. 1, which illustrates a method of massage using the embodiment of a roller massage device (1) shown in FIGS. 1-7 although the method can be applied to other embodiments including but not limited to FIGS. 8-10. A user (33) can grippingly engage a pair of handles (29)(30) one each in a corresponding one of a pair of hands (31)(32). The pair of handles (29)(30) in the closed condition (41) (as shown in the example of FIGS. 2, 3 and 8 through 10) can be drawn a sufficient distance outwardly toward the open condition (42) (as shown in the example FIGS. 1 and 4) to correspondingly dispose a pair of roller massage assemblies (2)(3) in opposed relation about a massageable portion (15) of a body (16). The user (33) can allow the pair of handles (29)(30) to return toward the closed condition (42) a sufficient distance to engage each one of the pair of roller massage assemblies (2)(3) on a massable portion (15) of the body (16). The user (33) can generate travel (67)(68) in the pair of roller assemblies (2)(3) by forcibly urging on each of the pair of handles (29)(30) in a first direction (67) on the massageable portion (15) of the body (16). The user (33) can forcibly urge each of the pair of handles (29)(30) in a second direction (69) to correspondingly generate travel in the pair of roller massage assemblies (2)(3) on the massageable portion (15) of the body (16) in the second direction (68).

While the illustrative example of FIG. 1 shows the massageable portion (15) of the body (16) as the upper portion of a leg (17) of a person; the invention is not so limited, and the massageable portion (15) of the body (16) can be any portion of the body (16) which can be massaged by travel of the pair of roller massage assemblies (2)(3) on the massageable portion (15) such as the lower leg, upper arm, lower arm, upper body, lower body, buttocks, hands, feet, or the like. Additionally, while the roller massage device (1) is shown massaging a portion of a body (16) of a person, the invention is not so limited, and applications may include a massageable portion of the body of other animals, such as cattle, horses, dogs, cats, or the like. Moreover, while the example of FIG. 1 shows the user (33) of the roller massage device (1) massaging the user's own massageable portion (15) of the body (16); the invention is not so limited, and the user (33) of the roller massage device (1) can be separate or independent or discrete from the massageable portion (15) of the body (16).

Now referring primarily to FIG. 9, as to particular embodiments the method can further include resiliently flexing the cross member to draw said pair of roller assemblies toward said drawn condition, or as to other particular embodiments as shown in FIG. 10, generating rotation of a first portion (46) and a second portion (47) of the cross member (40) about a central pivot axis (48) of cross member pivot element (49).

As can be easily understood from the foregoing, the basic concepts of the present invention may be embodied in a variety of ways. The invention involves numerous and varied embodiments of multiple flow channel particle analysis system including the best mode of a multiple flow channel particle analysis structure and methods of particle analysis using such multiple flow channel particle analysis structure.

As such, the particular embodiments or elements of the invention disclosed by the description or shown in the figures or tables accompanying this application are not intended to be limiting, but rather exemplary of the numerous and varied embodiments generically encompassed by the invention or equivalents encompassed with respect to any particular element thereof. In addition, the specific description of a single embodiment or element of the invention may not explicitly describe all embodiments or elements possible; many alternatives are implicitly disclosed by the description and figures.

It should be understood that each element of an apparatus or each step of a method may be described by an apparatus term or method term. Such terms can be substituted where desired to make explicit the implicitly broad coverage to which this invention is entitled. As but one example, it should be understood that all steps of a method may be disclosed as an action, a means for taking that action, or as an element which causes that action. Similarly, each element of an apparatus may be disclosed as the physical element or the action which that physical element facilitates. As but one example, the disclosure of "fluid stream" should be understood to encompass disclosure of the act of "streaming a fluid"—whether explicitly discussed or not—and, conversely, were there effectively disclosure of the act of "streaming a fluid", such a disclosure should be understood to encompass disclosure of "a fluid stream" and even a "means for streaming a fluid." Such alternative terms for each element or step are to be understood to be explicitly included in the description.

In addition, as to each term used it should be understood that unless its utilization in this application is inconsistent with such interpretation, common dictionary definitions should be understood to included in the description for each term as contained in the Random House Webster's Unabridged Dictionary, second edition, each definition hereby incorporated by reference.

All numeric values herein are assumed to be modified by the term "about", whether or not explicitly indicated. For the purposes of the present invention, ranges may be expressed as from "about" one particular value to "about" another particular value. When such a range is expressed, another embodiment includes from the one particular value to the other particular value. The recitation of numerical ranges by endpoints includes all the numeric values subsumed within that range. A numerical range of one to five includes for example the numeric values 1, 1.5, 2, 2.75, 3, 3.80, 4, 5, and so forth. It will be further understood that the endpoints of each of the ranges are significant both in relation to the other endpoint, and independently of the other endpoint. When a value is expressed as an approximation by use of the antecedent "about," it will be understood that the particular value forms another embodiment.

Thus the applicant(s) should be understood to claim at least: i) a multiple flow channel particle analysis structure as herein disclosed and described, ii) the related methods disclosed and described, iii) similar, equivalent, and even implicit variations of each of these devices and methods, iv) those alternative embodiments which accomplish each of the functions shown, disclosed, or described, v) those alternative designs and methods which accomplish each of the functions shown as are implicit to accomplish that which is disclosed and described, vi) each feature, component, and step shown as separate and independent inventions, vii) the applications enhanced by the various systems or components disclosed, viii) the resulting products produced by such systems or components, ix) methods and apparatuses substantially as described hereinbefore and with reference to any of the accompanying examples, x) the various combinations and permutations of each of the previous elements disclosed.

The background section of this patent application provides a statement of the field of endeavor to which the invention pertains. This section may also incorporate or contain paraphrasing of certain United States patents, patent applications, publications, or subject matter of the claimed invention useful in relating information, problems, or concerns about the state of technology to which the invention is drawn toward. It is not intended that any United States patent, patent application, publication, statement or other information cited or incorporated herein be interpreted, construed or deemed to be admitted as prior art with respect to the invention.

The claims set forth in this international PCT patent specification are hereby incorporated by reference as part of this description of the invention, and the applicant expressly reserves the right to use all of or a portion of such incorporated content of such claims as additional description to support any of or all of the claims or any element or component thereof, and the applicant further expressly reserves the right to move any portion of or all of the incorporated content of such claims or any element or component thereof from the description into the claims or vice-versa as necessary to define the matter for which protection is sought by this application or by any subsequent application or continuation, division, or continuation-in-part application thereof, or to obtain any benefit of, reduction in fees pursuant to, or to comply with the patent laws, rules, or regulations of any country or treaty, and such content incorporated by reference shall survive during the entire pendency of this application including any subsequent continuation, division, or continuation-in-part application thereof or any reissue or extension thereon.

The claims set forth in this specification, if any, are further intended to describe the metes and bounds of a limited number of the preferred embodiments of the invention and are not to be construed as the broadest embodiment of the invention or a complete listing of embodiments of the invention that may be claimed. The applicant does not waive any right to develop further claims based upon the description set forth above as a part of any continuation, division, or continuation-in-part, or similar application.

I claim:

1. A device, comprising:

a cross member having a cross member first end opposite a cross member second end;

a pair of handles correspondingly coupled proximate said cross member first end and said cross member second end, wherein at least one of said pair of handles pivotally coupled to said cross member; and a pair of roller assemblies correspondingly rotatably coupled to said pair of handles, wherein a rotation axis of each of said pair of roller assemblies intersects said cross member in generally orthogonal relation disposing said pair of roller assemblies in opposition facing relation between said pair of handles, wherein said pair of roller assemblies correspondingly rotatably coupled to said pair of handles each define a pass through between an outer periphery of each of said pair of roller assemblies and each of said pair of handles, each said pass through adapted to allow a hand to grippingly engage said handle without engaging said outer periphery of a corresponding one of said pair of roller assemblies.

2. The device of claim 1, further comprising:

a handle grip disposed between a handle first end and a handle second end; and a pair of axle supports correspondingly coupled to said handle first end and said handle second end, said pair of axle supports extending a distance inward of said handle grip.

3. The device of claim 2, wherein each of said pair of roller assemblies rotatably couples to a respective one of a pair of axles, said pair of axles each having an axle first end and an axle second end which correspondingly couple to said pair of axle supports.

4. The device of claim 3, wherein each of said pair of roller assemblies comprises a plurality of roller elements, each of said plurality of roller elements discretely rotatably coupled to a corresponding one of said pair of axles.

5. The device of claim 4, wherein said plurality of roller elements have spaced engagement along said corresponding one of said pair of axles.

6. The device of claim 5, wherein spaced engagement comprises an inter-roller space in the range of about one-eighth inch to about one-half inch.

7. The device of claim 4, wherein said plurality of roller elements have adjacent engagement along a medial portion of said axle.

8. The device of claim 4, wherein a medial portion of said pair of axles has an amount of curvature between said axle first end and said axle second end.

9. The device of claim 3, wherein said pair of roller assemblies each comprise a one-piece roller.

10. The device of claim 9, wherein said one-piece roller includes a medial portion having a lesser diameter than each of a pair of end portions.

11. The device of claim 2, further comprising a first pair of handle supports, each of said first pair of handle supports disposed between a first handle support first end and a first handle support second end, said first handle support first ends correspondingly pivotally coupled proximate said cross member first end and said cross member second end, said first handle support second ends correspondingly pivotally coupled proximate said handle first ends.

12. The device of claim 11, further comprising a second pair of handle supports, each of said second pair of handle supports disposed between a second handle support first end and a second handle support second end, said second handle support first ends correspondingly pivotally coupled to said cross member inward of said first pair of handle supports, said second handle support second ends correspondingly pivotally coupled to said pair of axle supports.

13. The device of claim 12, further comprising at least one elastic elements, said pair of handles responsive to said at least one elastic element to reduce distance between said pair of roller assemblies.

14. The device of claim 13, wherein said at least one elastic element comprise a pair of extension springs each having a spring first end coupled to said cross member and each a spring second end responsive to movement of a corresponding one of said pair of handles.

15. The device of claim 13, wherein said at least one elastic element comprise a pair of torsion springs having a spring first end coupled to said cross member and each a spring second end responsive to movement of a corresponding one of said pair of handles to reduce distance between said pair of roller assemblies.

* * * * *